United States Patent [19]

Fukuhara

[11] Patent Number: 4,627,103
[45] Date of Patent: Dec. 2, 1986

[54] S/N RATIO DETERMINING METHOD AND APPARATUS FOR A RECEIVER

[75] Inventor: Hiroshige Fukuhara, Yokosuka, Japan

[73] Assignee: Nissan Motor Company, Limited, Japan

[21] Appl. No.: 617,938

[22] Filed: Jun. 6, 1984

[30] Foreign Application Priority Data

Jun. 13, 1983 [JP] Japan ............................. 58-105540

[51] Int. Cl.⁴ ............................................ H04B 17/00
[52] U.S. Cl. .................................. 455/226; 324/57 N
[58] Field of Search ............... 455/67, 226; 324/57 N; 343/17.7; 364/551; 375/10

[56] References Cited

U.S. PATENT DOCUMENTS 3,350,643 10/1967 Webb .................................. 455/226
3,475,683 10/1969 Hulland ............................ 324/57 N
4,074,201 2/1978 Lennon ............................... 455/226
4,185,242 1/1980 Schaible ............................ 324/57 N

FOREIGN PATENT DOCUMENTS 56-2312 1/1981 Japan.

Primary Examiner—Jin F. Ng
Attorney, Agent, or Firm—Lowe, Price, LeBlanc, Becker & Shur

[57] ABSTRACT

The signal-to-noise ratio of a signal having positive and negative components is determined by periodically sampling polarity values of the signal. The numbers of the sampled values of each polarity are accumulated. A quantitative measure of the relative accumulated numbers of the sampled values of each polarity is determined. A stored function of signal-to-noise ratio as a function of the quantitative measure and the number of samples is correlated with the derived quantitative measure.

16 Claims, 11 Drawing Figures

S/N RATIO DETERMINING METHOD AND APPARATUS FOR A RECEIVER

BACKGROUND OF THE INVENTION

This invention relates to an S/N (signal to noise) ratio determining apparatus for a receiver.

In all kinds of receivers, the S/N ratio of the received signal comes almost necessarily into question. As an example, a Loran-C receiver will be described. Loran-C, a well-known hyperbolic radio navigation technique, includes a chain of a single master station and two secondary stations. As shown in FIG. 1(a) of the accompanying drawings, the master station transmits a signal M of 9 Loran pulses during a group period Tp while the secondary stations transmit signals $S_1$, $S_2$ each including 8 pulses having the same period as signal M but with different predetermined time lags with respect to the transmission timing of signal M.

The Loran-C receiver receives the signals, as shown in FIG. 1(a), produces sample pulses Pa, Pb, Pc, (as shown in FIG. 1(b)), simultaneously with the third cycles of the first pulses of signals M, $S_1$ and $S_2$, and derives the current position of the receiver on the basis of time lags $T_1$, $T_2$ of sample pulses Pb, Pc relative to sample pulse Pa. Each of sample pulses Pa, Pb, Pc consists of a pair of subpulses $P_1$, $P_2$ which are spaced by one-quarter wavelength (2.5$\mu$ sec), as shown in FIG. 2(b), of the carrier wave Ca (100 KHz) of Loran pulse LP. The Loran receiver matches one of subpulses $P_1$, $P_2$ with the peak of the third cycle of carrier wave Ca after matching the other subpulses with the preceding zero-crossing point of carrier wave Ca, as shown in FIGS. 2(a) and 2(b). Such a Loran-C receiver is disclosed in examined Japanese patent publication 56-2312 published on Jan. 19, 1981.

In the above Loran-C receiver, when the received amplitude of Loran pulse LP is low, as shown in FIG. 2(a), noise Nz causes the amplitude of the carrier wave Ca to fluctuate significantly, so that the tracking points of the sample pulses fluctuate, thereby degrading measurement accuracy.

The receiver samples the received signal a plurality of times and derives the mean value of the sampled values to track the third cycle of carrier wave Ca. The number of samples processed by the receiver must be increased when the S/N ratio is low however, increasing in the number of processed samples prolongs the time required for measurement. Thus, a minimum requisite number of samples should be determined in accordance with the S/N ratio in order to minimize the time required for accurate measurement.

In order to satisfy this requirement, accurate measurement of the S/N ratio of the received signal is required.

One conventional method of measuring the S/N ratio involves separating the signal component from the noise component and deriving the ratio between the amplitudes of the signal and noise components. However, this method does not provide an accurate S/N ratio when the noise frequency is close to the signal frequency.

It could be contemplated that, with the Loran-C signal as described above, one more sample pulse $P_3$ be produced at a point offset from Loran pulse LP to sample only noise Nz, as shown FIGS. 2(a) and (b), thereby deriving the ratio between the levels of the Loran pulse LP and noise Nz. However, in this case, noise Nz is also superimposed on the carrier wave in Loran pulse LP, so that the derived ratio would not be completely accurate. In particular, if the amplitude of noise Nz is not negligible compared to the amplitude of Loran pulse LP (i.e., when the S/N ratio is below about 10 dB), the accuracy of measurement of the S/N ratio is greatly affected.

SUMMARY OF THE INVENTION

It is therefore an object of this invention to provide an S/N ratio determining apparatus for a receiver which produces an accurate S/N ratio of a received signal without being affected by the frequency and/or amplitude of noise.

In summary, according to this invention, the apparatus includes means for repeatedly sampling the instantaneous amplitude of a received signal at predetermined phases a predetermined number of times. The sampled value is checked to see if it exceeds a predetermined reference value. The apparatus further includes means for deriving at least one of a first proportion of sampled values which exceeds the reference value and a second proportion of sampled values which does not exceed the reference value. The apparatus also includes means for deriving the S/N ratio of the received signal on the basis of the at least one of the first and the second proportions of the sampled values. The S/N ratio may be determined in correspondence with the difference between the first and second proportions, or the ratio of the first to second proportions. One of the first and second proportions may be derived from the other and the total number of samples.

The above and other objects, features and advantages of this invention will be understood from the following description of preferred and alternative embodiments thereof, taken in conjunction with the accompanying drawings.

DETAILED DESCRIPTION OF THE PREFERRED EMBODIMENT

Figure 1:
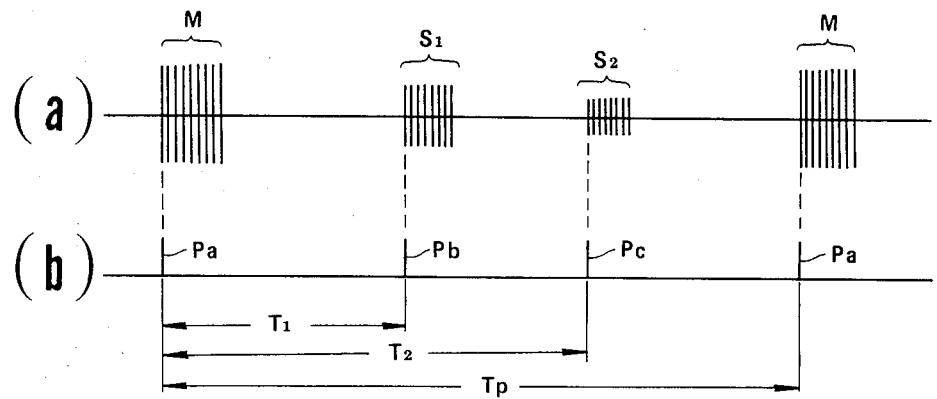
FIG. 1 is an illustration of the timing relationships among Loran-C signal pulses and sample pulses produced by a Loran-C receiver.
Figure 2:
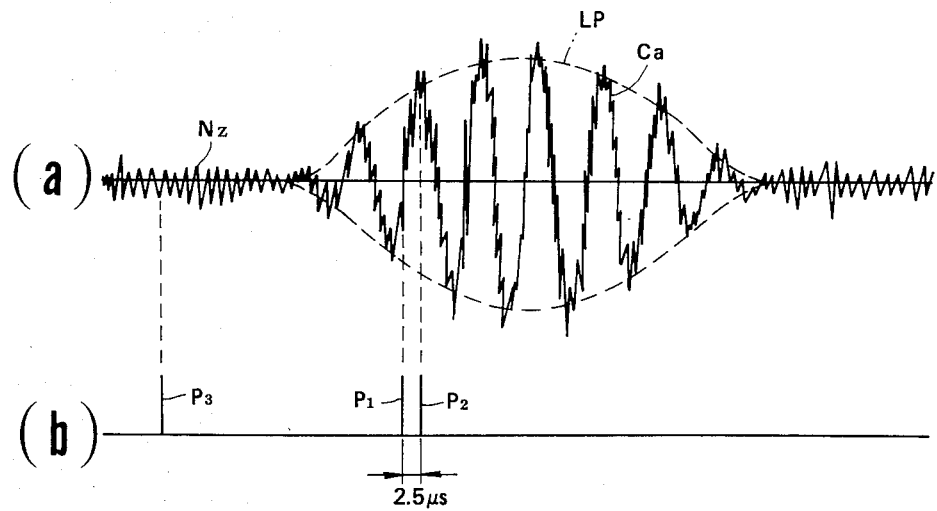
FIG. 2 is a trace of a Loran pulse of FIG. 1 on an expanded time scale.
Figure 3:
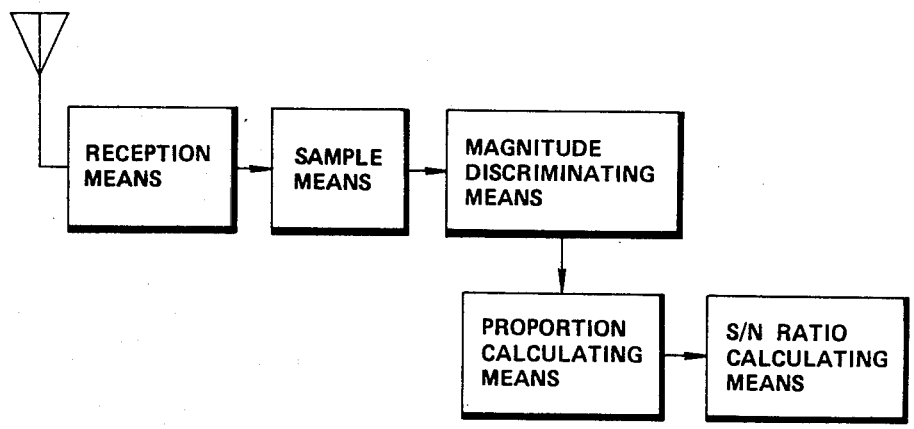
FIG. 3 is a block diagram of apparatus including the basic concept of this invention.

FIG. 3 is a block diagram of the basic concept of this invention, which has already been described briefly in the Summary of the Invention above.

Figure 4:
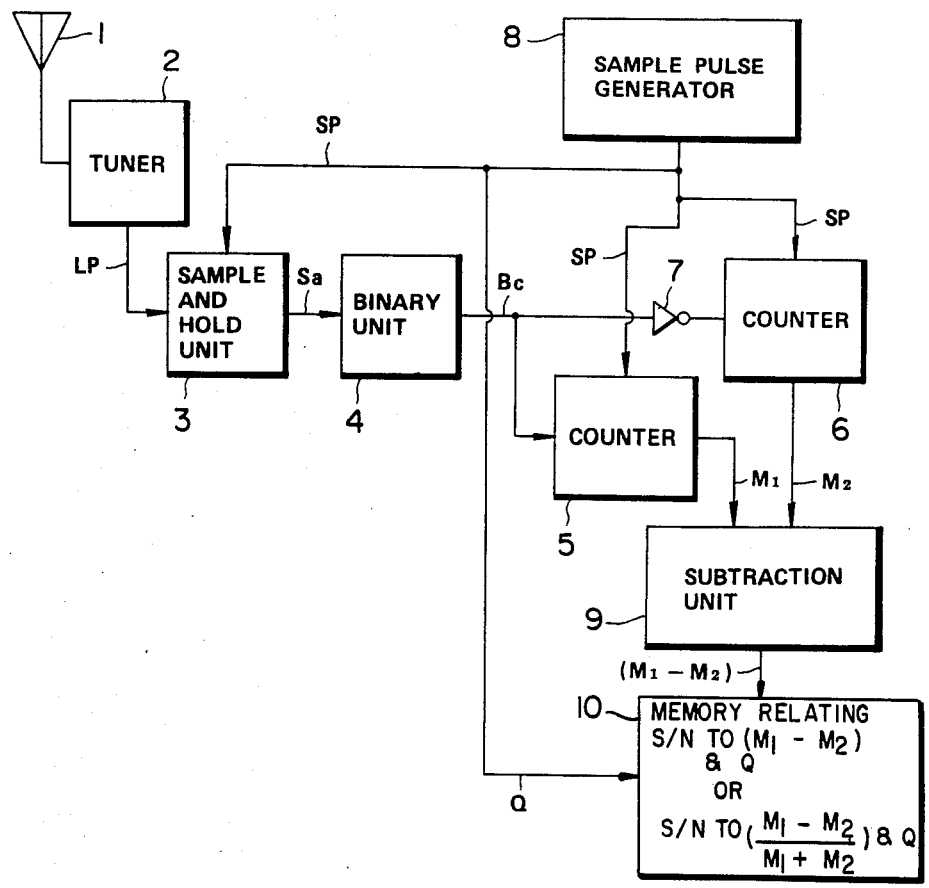
FIG. 4 is a more detailed block diagram of a preferred embodiment of an S/N ratio determining apparatus for a receiver according to this invention.

Reference is made to FIG. 4, a block diagram of a preferred embodiment of an S/N ratio determining apparatus for a receiver according to this invention. The apparatus is shown as being applied to a Loran-C receiver.

In the apparatus, a Loran-C signal LP received via an antenna 1 and a tuner 2 is supplied to a sample and hold unit 3. This unit 3 samples the instantaneous value of Loran-C pulse LP at predetermined phases in synchronism with sample pulses from a sample pulse generator 8 and holds the sampled instantaneous value. Sample pulse generator 8 generates sample pulses in phase with the carrier wave Ca of Loran pulse LP, on the basis of a sample pulse generation timing signal derived by tracking the third cycle of Loran pulse LP which is detected by a Loran pulse tracking unit (not shown).

The apparatus includes a binary unit 4 which processes the sampled value Sa and derives a corresponding binary signal Bc "1" or "0". Binary unit 4 may be composed of a comparator which derives a "1" when the sample value Sa from sample and hold unit 3 is at a positive amplitude and which derives "0" when the sampled value Sa is at a negative amplitude.

The apparatus also includes a counter 5 which counts sample pulses SP acting as a clock signal from sample pulse generator 8 only while the output Bc of binary unit 4 is "1", and a second counter 6 which counts sample pulses SP via an inverter 7 only while the output Bc is "0". The apparatus also includes a subtraction unit 9 which performs a subtraction $(M_1-M_2)$ where $M_1$ and $M_2$ are the counted values of counters 5 and 6, respectively, and an S/N ratio calculation unit 10 which derives the S/N ratio of the received signal on the basis of the output $(M_1-M_2)$ of subtraction unit 9.

S/N ratio calculation unit 10 may be composed of a microprocessor which includes a CPU, a memory and an interface combined in a well-known manner. Stored in advance in the memory of unit 10 are S/N ratio values corresponding to various subtraction values $(M_1-M_2)$ derived from subtraction unit 9. Calculation unit 10 derives a S/N ratio from the predetermined correlation between the memory contents and the subtraction value, shown by a graph of FIG. 7 in which indicia such as Q/2 and Q underlying the axis of abscissas should be used.

Figure 5:
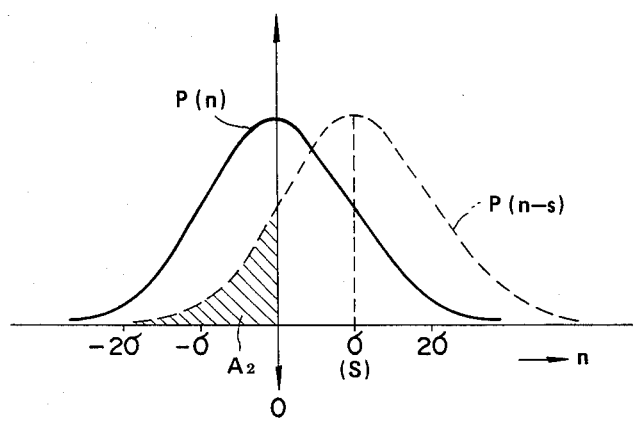
FIG. 5 is a plot of the probability distribution of values sampled by the apparatus.

Generally speaking, noise can be regarded as a random process obeying a Gaussian distribution. If the instantaneous amplitude of noise Nz is designated n, the probability distribution P(n) of the instantaneous amplitude n is represented by a probability density function having a mean value of zero but the variance, $\sigma^2$, i.e., square of the standard deviation $\sigma$ follows a Gaussian distribution, as shown in FIG. 5. The probability density function P(n) can be expressed . . .

$$P(n) = \frac{1}{\sqrt{2\pi\sigma^2}} e^{-\frac{n^2}{2\sigma^2}} \tag{1}$$

In the formula (1), a $\sigma^2$ corresponds to the electric power of noise and $\sigma$ corresponds to the effective noise amplitude.

Thus, when only noise Nz is sampled at sample and hold unit 3, the probabilities that the outputs Bc of binary unit 4 are "1" and "0" are the same and hence the outputs $M_1$ and $M_2$ of counters 5 and 6 will tend to match. Consequently, the output $(M_1-M_2)$ of subtraction unit 9 is zero, at which time the received signal is composed of noise, so that the S/N ratio is $-\infty$ (infinity) dB (refer to FIG. 7).

Figure 6:
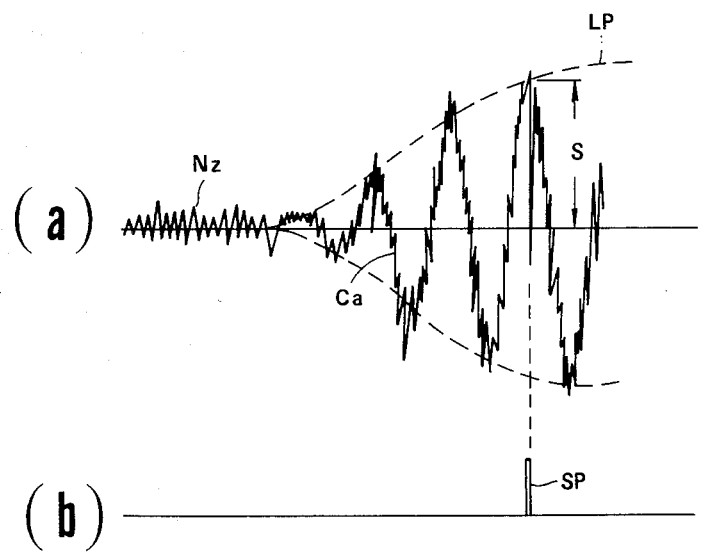
FIG. 6 includes waveforms for the relationship between Loran pulse and sample pulses.

When sample pulse SP coincides with the peak of the carrier Ca of Loran pulse LP where the amplitude of carrier Ca is designated S, as shown in FIG. 6(a), (b), the sampled value Sa is negative when the amplitude n of noise Nz is less than $-S$, so that the output Bc of binary unit 4 is "0". When the noise amplitude n is greater than $-S$, sampled value Sa is positive, so that binary unit output Bc is "1".

The probability distribution of values derived by sampling the peaks of the carrier waves Ca of n Loran pulses LP is represented by the broken line curve P(n−S) in FIG. 5 in which the mean value is S and the square of the standard deviation $\sigma^2$ follows a Gaussian distribution: that is, this curve can be obtained by parallel shift of the probability distribution P(n) by S in the positive direction.

The probability density function in this case can be expressed as follows:

$$P(n-S) = \frac{1}{\sqrt{2\pi\sigma^2}} e^{-\frac{(n-S)^2}{2\sigma^2}} \tag{2}$$

In the probability distribution P(n−S), the area $A_2$ hatched in FIG. 5 equals the probability that sampled value Sa is negative. Thus, the probability $A_1$ that sampled value Sa is positive is $1-A_2$.

Thus, the output $M_2$ of counter 6 after Q samples can be expressed . . .

$$M_2 = Q \times A_2 \tag{3}$$
$$= Q \times \frac{1}{\sqrt{2\pi\sigma^2}} \int_{-\infty}^{0} e^{-\frac{(n-S)^2}{2\sigma^2}} dn$$

The output $M_1$ of counter 5 is given by $$M_1 = Q - M_2 = Q(1-A_2) \tag{4}$$

Thus, the difference between $M_1$ and $M_2$ is given by $$M_1 - M_2 = Q(1-A_2) - QA_2 \tag{5}$$
$$= Q(1-2A_2)$$

In the case shown in FIG. 5, the mean value S of probability density function P(n−S) of sampled value Sa is equal to $\sigma$, so that P(n−S)=S corresponds to an S/N ratio of 0 dB. Thus, from formula (5), the value of $(M_1-M_2)$ is given by $$M_1 - M_2 = Q\left(1 - \frac{2}{\sqrt{2\pi\sigma^2}} \int_{-\infty}^{0} e^{-\frac{(n-S)^2}{2\sigma^2}} dn\right) \tag{6}$$

$$= Q(1 - 2 \times 0.1587)$$
$$= 0.6826 \, Q = 0.6826(M_1 + M_2)$$

That is, if the value of $(M_1-M_2)/(M_1+M_2)$ is 0.6826, it will be understood that the S/N ratio is zero dB.

Figure 7:
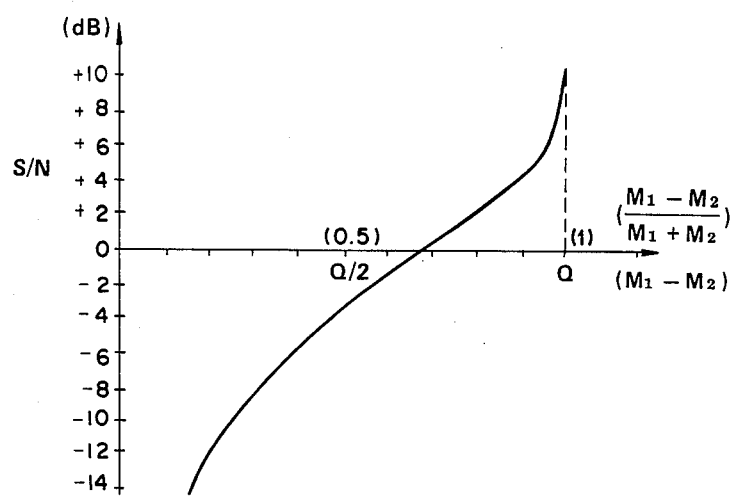
FIG. 7 is a graph of the correlation between one calculated value and the S/N ratio.

The correlation between value $(M_1-M_2)/(M_1+M_2)$ and S/N ratio is obtained by sequentially substituting appropriate numerical values into n and S of formula (6) and obtaining the value of formula (6). The correlation is represented by the quadratic curve as shown in FIG. 7. Thus, storage of a data map of FIG. 7 in the memory of S/N calculation unit 10 enables derivation of the S/N ratio of the received signal from the output $(M_1-M_2)/(M_1+M_2)$ of calculation unit 10. In this case, indicia such as 0.5 and 1 underlying the axis of abscissas should be used, and not Q/2 and Q.

Figure 8:
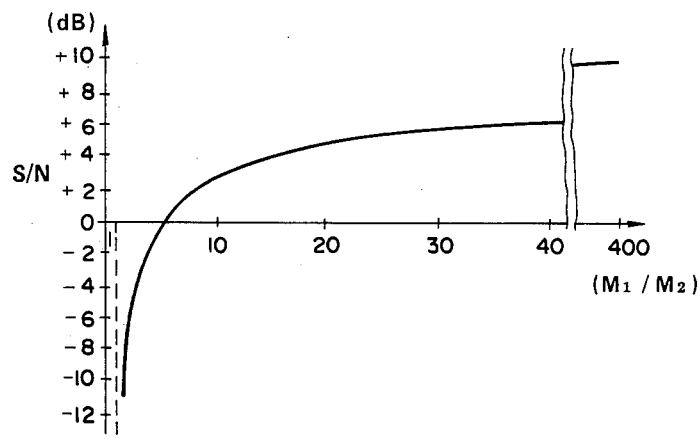
FIG. 8 is a graph of the correlation between another calculated value and the S/N ratio.
Figure 9:
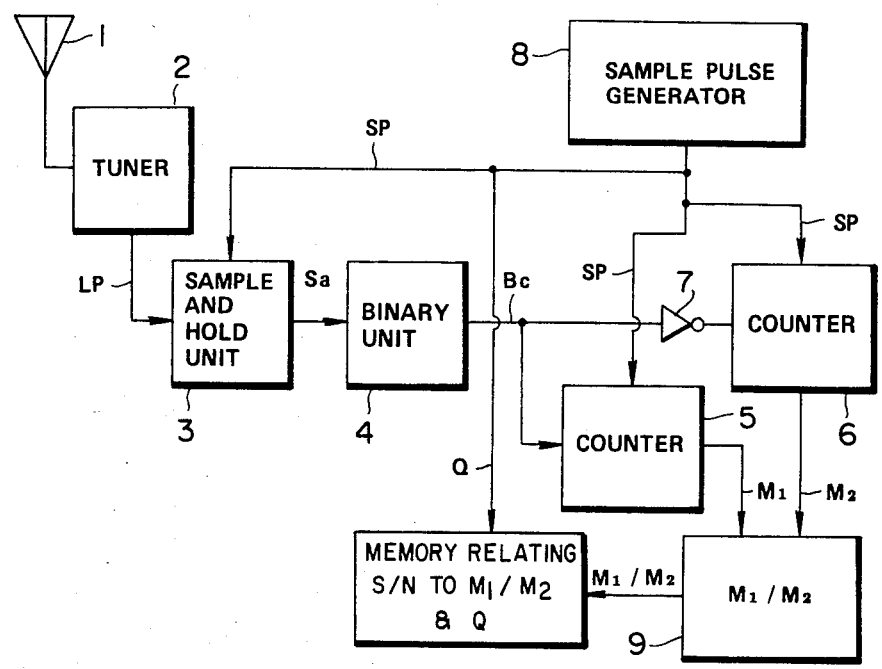
FIG. 9 is a block diagram of a second embodiment of this invention.

The S/N ratio may alternatively be obtained with the apparatus of FIG. 9, from the correlation between count ratio $M_1/M_2$ and S/N ratio, as shown in FIG. 8.

Figure 10:
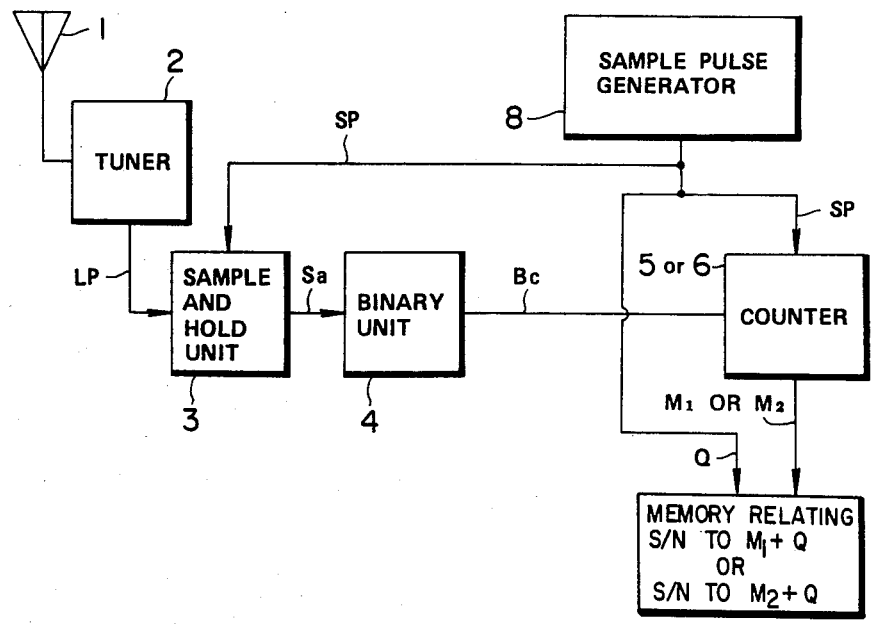
FIG. 10 is a block diagram of a third embodiment of this invention.

This embodiment includes counters 5, 6 which count both types of outputs Bc, i.e. "1" and "0", respectively, of binary unit 4, but if the number of samples is selected in advance, and if one of counts $M_1$ and $M_2$ is known, the other count can be obtained by calculation from the total number of samples. That is, as will be obvious from formulae (3), (4), the S/N ratio may be obtained from either $M_1$ or $M_2$. Alternatively, in FIG. 10, the S/N ratio computer 10 can calculate $M_1$ or $M_2$ using the following:

$$M_1 = Q \times A_1 = Q \times \frac{1}{\sqrt{2\pi\sigma^2}} \int_{-0}^{\infty} e^{-\frac{(n-S)^2}{2\sigma^2}} dn$$

$$M_2 = Q \times A_2 = Q \times \frac{1}{\sqrt{2\pi\sigma^2}} \int_{-\infty}^{0} e^{-\frac{(n-S)^2}{2\sigma^2}} dn$$

Figure 11:
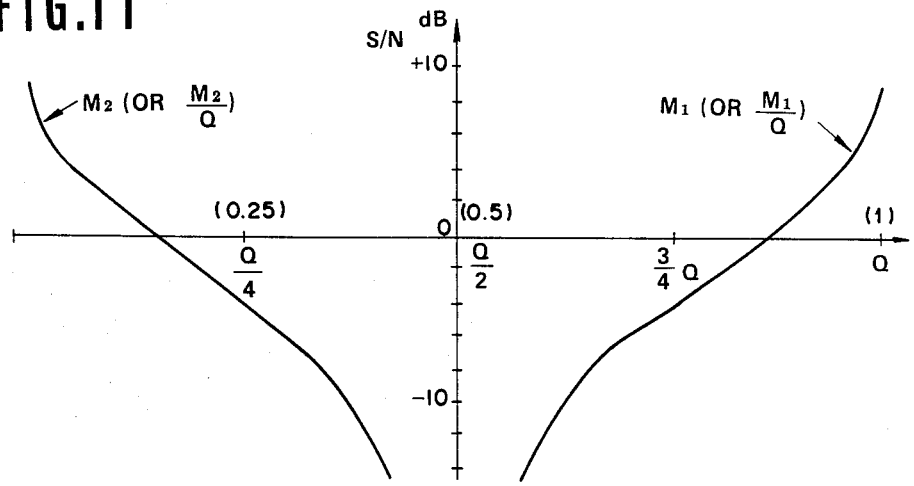
FIG. 11 is a graph similar to FIG. 7 obtained by the embodiment of FIG. 10.

The correlation between $M_1$ and $M_2$ and S/N is represented by the graph of FIG. 11. In place of $M_1$ or $M_2$, $M_1/Q$ or $M_2/Q$, shown bracketed, may be used in which case the indicia Q/4, Q/2 and Q should be replaced with 0.25, 0.5 and 1, respectively, as shown bracketed in FIG. 11.

While the above description has been made with respect to Loran-C receivers, the above S/N ratio determining apparatus is applicable to omega receivers also used for radio navigation, general radio receivers, receivers for communications systems, etc.

As is obvious from the above, the S/N ratio determining apparatus according to this invention enables the S/N ratio of a received signal to be derived precisely even when the amplitude of the received signal is weak and hence the S/N ratio thereof is very low, for example, below 10 dB, and without being adversely affected by noise frequency.

While this invention has been shown and described in terms of preferred embodiments thereof, it should be noted that this invention is not limited thereto. These are illustrated only as examples. Various changes and modifications could be made by those skilled in the art without departing from the scope of this invention as set forth in the attached claims.

What is claimed is:

1. An apparatus for determining the S/N (signal/-noise) ratio of a receiver, comprising:
   means for repeatedly sampling the instantaneous amplitude of a received signal at a predetermined signal phase for a predetermined number of said received signal cycles;
   means for comparing the sampled instantaneous amplitude with a predetermined reference value for discriminating whether or not the sampled value is greater than said predetermined reference value, which comparing and discriminating means produces a discriminator signal indicative of the result of discrimination;
   means responsive to said discriminator signal for separately counting a first occurrence in which said discriminator signal is indicative of the sampled value being greater than said predetermined reference value, and a second occurrence in which said discriminator signal indicative of the sampled value being smaller than said predetermined reference value, and for calculating at least one of a first proportion of sampled values which exceeds the reference value based on the count value of said first occurrence and a second proportion of sampled values which are less than the reference value based on the count value of said second occurrence; and
   means for deriving the S/N ratio of the received signal on the basis of said at least one of the first and second proportions of the sampled values.

2. A method for determining the signal-to-noise (S/N) ratio of received signal, comprising the steps of:
   (a) sampling the amplitude of the received signal at a predetermined received signal phase;
   (b) comparing the sampled value with a predetermined reference value;
   (c) counting a first occurrence in which said sampled value is greater than said reference value;
   (d) repeating said steps (a) to (c) for a predetermined number of received signal cycles;
   (e) deriving a proportion of the sampled value which exceeds said predetermined reference value on the basis of said predetermined number of said received signal cycles and the count value of said occurrence; and
   (f) determining the S/N ratio of the received signal from a known relationship between S/N ratio and said determined proportion.

3. An apparatus for determining the S/N (signal/-noise) ratio of a receiver, comprising:
   means for repeatedly sampling the instantaneous amplitude of a received signal at predetermined phases a predetermined number of times;
   means for discriminating whether or not the sampled value is greater than a predetermined reference value;
   means responsive to the received signal being sampled the predetermined number of times for calculating at least one of a first proportion of sampled values which exceeds the reference value and a second proportion of sampled values which are less than the reference value; and
   means for deriving the S/N ratio of the received signal on the basis of said at least one of the first and second proportions of the sampled values, said means for deriving the S/N ratio of the received signal including means for calculating $(M_1-M_2)/(M_1+M_2)$, wherein $M_1$ and $M_2$ are the first and second proportions, respectively, and the first and second proportions $M_1$ and $M_2$ are defined by $M_1=Q\times A_1$ and $M_2=Q\times A_2$, respectively, where Q is the predetermined number of times, $A_1$ is given by the probability density function defined by $$\frac{1}{\sqrt{2\pi\sigma^2}} \int_0^\infty e^{-\frac{(n-S)^2}{2\sigma^2}} dn,$$

$A_2$ is defined by the probability density function $$\frac{1}{\sqrt{2\pi\sigma^2}} \int_{-\infty}^0 e^{-\frac{(n-S)^2}{2\sigma^2}} dn,$$

n is the sampled amplitude of noise contained in the received signal, S is the sampled amplitude of the received signal, and $\sigma$ is the standard deviation of n.

4. An apparatus as claimed in claim 3, wherein said means for deriving the S/N ratio of the received signal further includes a memory having a data map for storing S/N ratio values corresponding to the $(M_1-M_2)/(M_1+M_2)$ values and means for retrieving the S/N ratio of the received signal corresponding to the currently calculated $(M_1-M_2)/(M_1+M_2)$ value.

5. An apparatus for determining the S/N (signal/noise) ratio of a receiver, comprising:
 means for repeatedly sampling the instantaneous amplitude of a received signal at predetermined phases a predetermined number of times;
 means for discriminating whether or not the sampled value is greater than a predetermined reference value;
 means responsive to the received signal being sampled the predetermined number of times for calculating at least one of a first proportion of sampled values which exceeds the reference value and a second proportion of sampled values which are less than the reference value; and
 means for deriving the S/N ratio of the received signal on the basis of said at least one of the first and second proportions of the sampled values, said means for deriving the S/N ratio of the received signal including means for deriving the ratio of the first and second proportions, and the first and second proportions $M_1$ and $M_2$ are defined by $M_1 = Q \times A_1$ and $M_2 = Q \times A_2$, respectively, where Q is the predetermined number of times, $A_1$ is given by the probability density function defined by $$\frac{1}{\sqrt{2\pi\sigma^2}} \int_0^\infty e^{-\frac{(n-S)^2}{2\sigma^2}} dn,$$

$A_2$ is defined by the probability density function $$\frac{1}{\sqrt{2\pi\sigma^2}} \int_{-\infty}^0 e^{-\frac{(n-S)^2}{2\sigma^2}} dn,$$

n is the sampled amplitude of noise contained in the received signal, S is the sampled amplitude of the received signal, and $\sigma$ is the standard deviation of n.

6. An apparatus as claimed in claim 5, wherein said means for deriving the S/N ratio of the received signal further includes a memory in which a data map is stored in which the S/N ratio value corresponds to the ratio of the first to second proportions and means for retrieving the S/N ratio of the received signal corresponding to the derived ratio of the first and second proportions.

7. An apparatus for determining the S/N (signal/noise) ratio of a receiver, comprising:
 means for repeatedly sampling the instantaneous amplitude of a received signal at predetermined phases a predetermined number of times;
 means for discriminating whether or not the sampled value is greater than a predetermined reference value;
 means responsive to the received signal being sampled the predetermined number of times for calculating at least one of a first proportion of sampled values which exceeds the reference value and a second proportion of sampled values which are less than the reference value; and
 means for deriving the S/N ratio of the received signal on the basis of said at least one of the first and second proportions of the sampled values, said means for deriving the S/N ratio of the received signal including means for deriving one of the first and second proportions of sampled values from the predetermined number of times and the other of the first and second proportions $M_1$ and $M_2$ on the basis of the corresponding one of $M_1 = Q - M_2 = Q(1-2A_2)$ and $M_2 = Q - M_1 = Q(1-2A_1)$ where Q is the predetermined number of times, $A_1$ is defined by the probability density function $$\frac{1}{\sqrt{2\pi\sigma^2}} \int_0^\infty e^{-\frac{(n-S)^2}{2\sigma^2}} dn$$

and $A_2$ is defined by the probability density function $$\frac{1}{\sqrt{2\pi\sigma^2}} \int_{-\infty}^0 e^{-\frac{(n-S)^2}{2\sigma^2}} dn$$

n is the sampled amplitude of noise contained in the received signal, S is the sampled amplitude of the received signal, and $\sigma$ is the standard deviation of n.

8. An apparatus as claimed in claim 7, wherein said means for deriving the S/N ratio of the received signal further includes a memory having a data map for storing S/N ratio values corresponding to said one of the first and second proportions and means for retrieving the S/N ratio of the received signal corresponding to said one of the first and second proportions.

9. An apparatus for determining the S/N (signal/noise) ratio of a receiver, comprising:
 means for repeatedly sampling the instantaneous amplitude of a received signal at predetermined phases a predetermined number of times;
 means for discriminating whether or not the sampled value is greater than a predetermined reference value;
 means responsive to the received signal being sampled the predetermined number of times for calculating at least one of a first proportion of sampled values which exceeds the reference value and a second proportion of sampled values which are less than the reference value; and
 means for deriving the S/N ratio of the received signal on the basis of said at least one of the first and second proportions of the sampled values, the first and second proportions $M_1$ and $M_2$ being defined by $M_1 = Q \times A_1$ and $M_2 = Q \times A_2$, respectively, where Q is the predetermined number of times, $A_1$ is defined by the probability density function defined by $$\frac{1}{\sqrt{2\pi\sigma^2}} \int_0^\infty e^{-\frac{(n-S)^2}{2\sigma^2}} \, dn,$$

$A_2$ is defined by the probability density function $$\frac{1}{\sqrt{2\pi\sigma^2}} \int_{-\infty}^0 e^{-\frac{(n-S)^2}{2\sigma^2}} \, dn,$$

n is the sampled amplitude of noise contained in the received signal, S is the sampled amplitude of the received signal, and $\sigma$ is the standard deviation of n.

10. An apparatus as defined in claim 9, wherein said means for deriving the S/N ratio of the received signal includes means for calculating $(M_1-M_2)$ where $M_1$ and $M_2$ are the first and second proportions, respectively, a memory in which a data map is stored in which S/N ratio values correspond to the $(M_1-M_2)$ values, and means for retrieving the S/N ratio of the received signal corresponding to the currently calculated $(M_1-M_2)$.

11. A method for determining the signal-to-noise (S/N) ratio of received signal, comprising the steps of:
(a) sampling the amplitude of the received signal at a predetermined received signal phase;
(b) comparing the sampled value with a predetermined reference value;
(c) counting occurrences in which said sampled value is smaller than said reference value;
(d) repeating said steps (a) to (c) for a predetermined number of received signal cycles;
(e) deriving a proportion of the sampled value which is less than said predetermined reference value on the basis of said predetermined number of said received signal cycles and the count value of said occurrence; and
(f) determining the S/N ratio of the received signal from a known relationship between S/N ratio and said proportion.

12. A method for determining the signal-to-noise (S/N) ratio of received signal, comprising the steps of:
(a) sampling the amplitude of the received signal at a predetermined received signal phase;
(b) comparing the sampled value with a predetermined reference value;
(c) counting first occurrences in which said sampled value is greater than said reference value;
(d) counting second occurrences in which said sampled value is smaller than said second value;
(e) repeating said steps (a) to (d) for a predetermined number of received signal cycles;
(f) deriving a first proportion of the sampled value which exceeds said predetermined reference value and a second proportion of the sampled value which is less than said predetermined reference value on the basis of said predetermined number of said receiver signal cycles and the count values of said first and second occurrences; and
(g) determining the S/N ratio of the received signal from a known relationship between S/N ratio and said first and second proportions.

13. Apparatus for determining the signal-to-noise ratio of a signal having positive and negative components comprising means for periodically sampling polarity values of the signal, means for accumulating the numbers of the sampled values of each polarity, means responsive to the accumulating means for deriving a quantitative measure of the relative accumulated numbers of the sampled values of each polarity, and memory means for correlating a stored function of signal-to-noise ratio as a function of the quantitative measure and the number of samples with the derived quantitative measure.

14. A method of determining the signal-to-noise ratio of a signal having opposite positive and negative components comprising the steps of periodically sampling polarity values of the signal, accumulating the numbers of the sampled polarity values of each polarity, deriving a quantitative measure of the relative accumulated numbers of the sampled polarity values, and correlating a stored function of signal-to-noise ratio as a function of the quantitative measure and the number of samples with the derived quantitative measure and the number of samples actually taken.

15. Apparatus for determining the signal-to-noise ratio of a signal comprising means for periodically sampling values of the signal to determine the number of sampled values relative to a reference level and for accumulating the numbers of the sampled values relative to said level, means responsive to the accumulated values for deriving a quantitative measure of the relative accumulated numbers of the sampled values above said reference level to the number of sampled values less than said reference level, and memory means for correlating a stored function of signal-to-noise ratio as a function of the quantitative measure and the number of samples with the derived quantitative measure.

16. A method of determining the signal-to-noise ratio of a signal comprising periodically sampling values of the signal to determine the number of sampled values relative to a reference level, accumulating the numbers of the sampled values relative to said level, deriving a quantitative measure of the relative accumulated numbers of the sampled values above said reference level to the number of sampled values less than said reference level, and correlating a stored function of signal-to-noise ratio as a function of the quantitative measure and the number of samples with the derived quantitative measure.

* * * * *